United States Patent
Takayanagi et al.

(10) Patent No.: US 11,693,073 B2
(45) Date of Patent: Jul. 4, 2023

(54) MAGNETIC RESONANCE IMAGING APPARATUS, IMAGING PARAMETER DETERMINING METHOD, AND NON-VOLATILE COMPUTER-READABLE STORAGE MEDIUM STORING THEREIN IMAGING PARAMETER DETERMINING PROGRAM

(71) Applicant: CANON MEDICAL SYSTEMS CORPORATION, Otawara (JP)

(72) Inventors: Ryohei Takayanagi, Otawara (JP); Hiroki Kondo, Nasushiobara (JP); Masaaki Umeda, Sakura (JP); Naoyuki Furudate, Otawara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/513,083

(22) Filed: Oct. 28, 2021

(65) Prior Publication Data
US 2022/0137171 A1 May 5, 2022

(30) Foreign Application Priority Data
Nov. 4, 2020 (JP) ............................ JP2020-184483

(51) Int. Cl.
*G01V 3/00* (2006.01)
*G01R 33/483* (2006.01)
*G01R 33/54* (2006.01)

(52) U.S. Cl.
CPC ....... *G01R 33/4835* (2013.01); *G01R 33/543* (2013.01)

(58) Field of Classification Search
CPC .............. G01R 33/3415; G01R 33/543; G01R 33/5659; G01R 33/36; A61B 5/055
USPC ....................................................... 324/309
See application file for complete search history.

(56) References Cited

U.S. PATENT DOCUMENTS

| 5,999,839 A * | 12/1999 | Hardy | G01R 33/563 324/306 |
| 9,014,783 B2 * | 4/2015 | Rehwald | G01R 33/5602 600/407 |
| 2018/0348326 A1 | 12/2018 | Miyazaki | |

FOREIGN PATENT DOCUMENTS

| JP | 2018-202122 A | 12/2018 | |
| WO | WO-2012043198 A1 * | 4/2012 | ............ A61B 5/0285 |
| WO | WO-2015175570 A1 * | 11/2015 | ......... A61B 18/1206 |

* cited by examiner

*Primary Examiner* — Walter L Lindsay, Jr.
*Assistant Examiner* — Frederick Wenderoth
(74) *Attorney, Agent, or Firm* — Oblon, McClelland, Maier & Neustadt, L.L.P.

(57) ABSTRACT

A magnetic resonance imaging apparatus according to an embodiment includes processing circuitry configured, on a basis of one or both of (A) a parameter related to applying one of inversion and flip pulses and (B) an intensity of a slice selecting gradient magnetic field applied together with the one of the pulses in relation to selecting a slice to which the one of the pulses is applied, to determine one or both of (A) a parameter related to applying the other of the inversion and (B) flip pulses; and an intensity of the slice selecting gradient magnetic field applied together with the other of the pulses in relation to selecting a slice to which the other of the pulses is applied.

8 Claims, 10 Drawing Sheets

BAND OF RF PULSE          BAND OF RF PULSE

BAND OF                    BAND OF FLIP PULSE
INVERSION PULSE

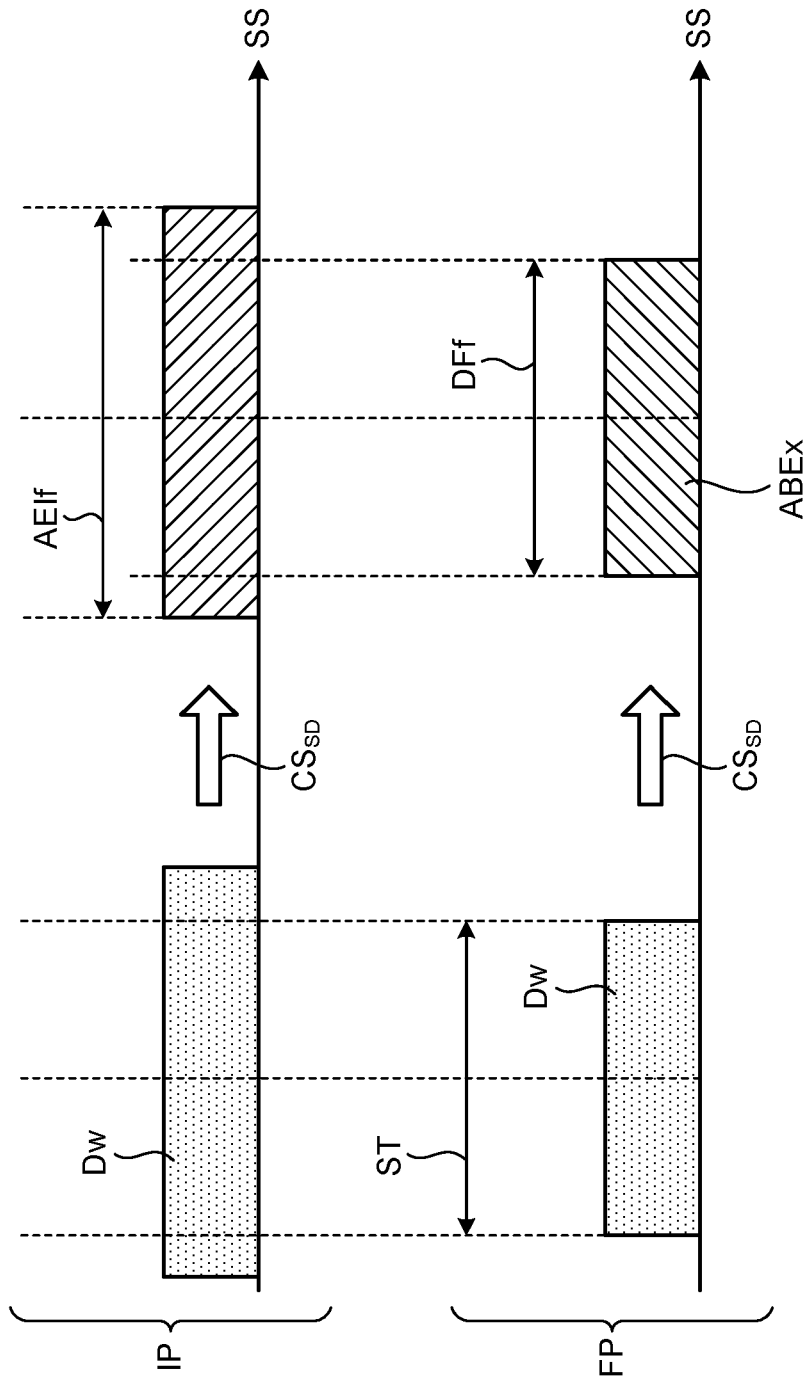

(12) United States Patent

MAGNETIC RESONANCE IMAGING APPARATUS, IMAGING PARAMETER DETERMINING METHOD, AND NON-VOLATILE COMPUTER-READABLE STORAGE MEDIUM STORING THEREIN IMAGING PARAMETER DETERMINING PROGRAM

CROSS-REFERENCE TO RELATED APPLICATIONS

This application is based upon and claims the benefit of priority from Japanese Patent Application No. 2020-184483, filed on Nov. 4, 2020; the entire contents of which are incorporated herein by reference.

FIELD

Embodiments described herein relate generally to a magnetic resonance imaging apparatus, an imaging parameter determining method, and a non-volatile computer-readable storage medium storing therein an imaging parameter determining program.

BACKGROUND

Conventionally, Short TI Inversion Recovery (STIR) methods are known as methods implemented by Magnetic Resonance Imaging (hereinafter, "MRI") apparatuses to obtain fat-suppressed images. Further, it is also known that a chemical shift occurs because the magnetic resonance frequency of water is different from the magnetic resonance frequency of fat.

BRIEF DESCRIPTION OF THE DRAWINGS

FIG. 11 is a drawing according to the application example of the embodiment illustrating an example of a relationship of slice positions excited by the inversion pulse and the flip pulse, in relation to FIG. 10.

DETAILED DESCRIPTION

A Magnetic Resonance Imaging (hereinafter, "MRI") apparatus, an imaging parameter determining method, and an imaging parameter determining computer program (hereinafter, "imaging parameter determining program") will be explained in detail, with reference to the accompanying drawings. Technical concepts of the embodiments disclosed herein may be applied to any of various types of modalities realized by combination with an MRI apparatus, such as Positron Emission Tomography (PET)-MRI apparatuses and Single Photon Emission Computed Tomography (SPECT)-MRI apparatuses.

Embodiments

A magnetic resonance imaging apparatus according to an embodiment includes processing circuitry. The processing circuitry, on a basis of one or both of (A) a parameter related to applying one of inversion and (B) flip pulses; and an intensity of a slice selecting gradient magnetic field applied together with the one of the pulses in relation to selecting a slice to which the one of the pulses is applied, determines one or both of (A) a parameter related to applying the other of the inversion and flip pulses and (B) an intensity of the slice selecting gradient magnetic field applied together with the other of the pulses in relation to selecting a slice to which the other of the pulses is applied.

Figure 1:
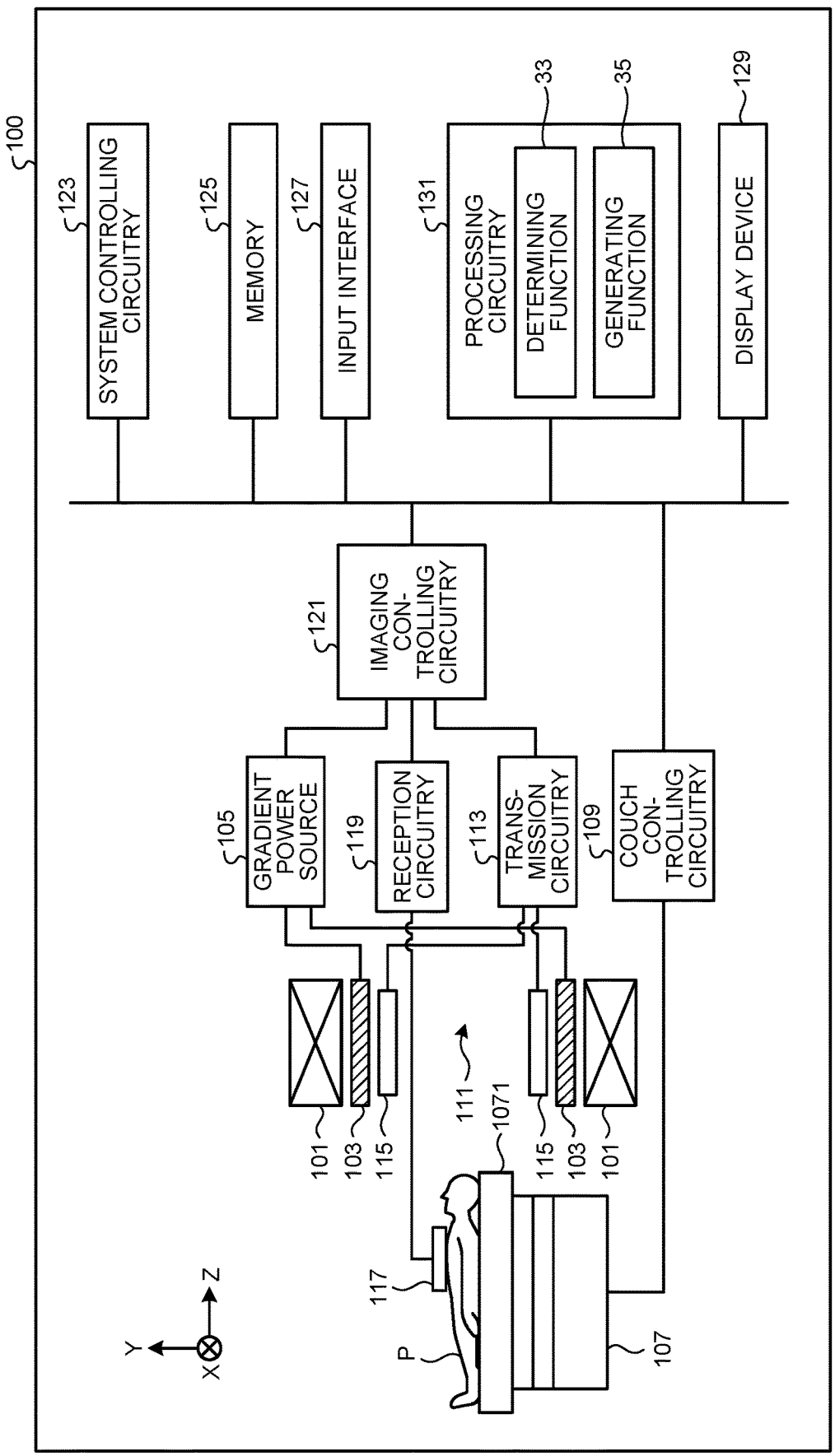
FIG. 1 is a block diagram illustrating an example of a magnetic resonance imaging apparatus according to an embodiment.

FIG. 1 is a diagram illustrating an example of an MRI apparatus 100 according to an embodiment of the present disclosure. As illustrated in FIG. 1, the MRI apparatus 100 includes a static magnetic field magnet 101, a gradient coil 103, a gradient power source 105, a couch 107, a couch controlling circuitry 109, transmission circuitry 113, a transmission coil 115, a reception coil 117, reception circuitry 119, imaging controlling circuitry (an imaging controlling unit) 121, system controlling circuitry (a system controlling unit) 123, a memory 125, an input interface 127, a display device 129, and processing circuitry 131.

The static magnetic field magnet 101 is a magnet formed to have a hollow and substantially circular cylindrical shape. The static magnetic field magnet 101 is configured to generate a substantially uniform static magnetic field in the space on the inside thereof. For example, a superconductive magnet or the like may be used as the static magnetic field magnet 101.

The gradient coil 103 is a coil formed to have a hollow and substantially circular cylindrical shape and is arranged on the inner surface side of a cooling container having a circular cylindrical shape. By individually receiving a supply of an electric current from the gradient power source 105, the gradient coil 103 is configured to generate gradient magnetic fields of which the magnetic field intensities change along X-, Y-, and Z-axes that are orthogonal to one another. For example, the gradient magnetic fields generated by the gradient coil 103 along the X-, Y-, and Z-axes form a slice selecting-purpose gradient magnetic field, a phase encoding-purpose gradient magnetic field, and a frequency encoding-purpose gradient magnetic field. The slice selecting-purpose gradient magnetic field is used for arbitrarily determining an imaged cross-sectional plane. The phase encoding-purpose gradient magnetic field is used for changing the phase of a magnetic resonance signal (hereinafter, "MR signal") in accordance with a spatial position. The frequency encoding-purpose gradient magnetic field is used for changing the frequency of an MR signal in accordance with a spatial position.

The gradient power source 105 is a power source device configured to supply the electric currents to the gradient coil 103, under control of the imaging controlling circuitry 121.

The couch 107 is a device including a couchtop 1071 on which an examined subject (hereinafter "patient") P is placed. Under control of the couch controlling circuitry 109, the couch 107 is configured to insert the couchtop 1071 on which the patient P is placed, into a bore 111.

The couch controlling circuitry 109 is circuitry configured to control the couch 107. By driving the couch 107 according to an instruction from an operator received via the input interface 127, the couch controlling circuitry 109 moves the couchtop 1071 in longitudinal directions and up-and-down directions, as well as left-and-right directions in some situations.

The transmission circuitry 113 is configured to supply a radio frequency pulse modulated with a Larmor frequency to the transmission coil 115, under control of the imaging controlling circuitry 121. For example, the transmission circuitry 113 includes an oscillating unit, a phase selecting unit, a frequency converting unit, an amplitude modulating unit, a Radio Frequency (RF) amplifier, and the like. The oscillating unit is configured to generate an RF pulse having a resonance frequency unique to a target atomic nucleus positioned in the static magnetic field. The phase selecting unit is configured to select a phase of the RF pulse generated by the oscillating unit. The frequency converting unit is configured to convert the frequency of the RF pulse output from the phase selecting unit. The amplitude modulating unit is configured to modulate the amplitude of the RF pulse output from the frequency converting unit according to a sine mathematical function, for example. The RF amplifier is configured to amplify the RF pulse output from the amplitude modulating unit and to supply the amplified RF pulse to the transmission coil 115.

The transmission coil 115 is a Radio Frequency (RF) coil arranged on the inside of the gradient coil 103. The transmission coil 115 is configured to generate an RF pulse corresponding to a radio frequency magnetic field, in accordance with the output from the transmission circuitry 113.

The reception coil 117 is an RF coil arranged on the inside of the gradient coil 103. The reception coil 117 is configured to receive an MR signal emitted from the patient P due to the radio frequency magnetic field. The reception coil 117 is configured to output the received MR signal to the reception circuitry 119. For example, the reception coil 117 is a coil array including one or more, typically two or more, coil elements. In the following sections, to explain a specific example, the reception coil 117 is assumed to be a coil array including two or more coil elements.

Alternatively, the reception coil 117 may be structured with one coil element. Further, although FIG. 1 depicts the transmission coil 115 and the reception coil 117 as separate RF coils, the transmission coil 115 and the reception coil 117 may be implemented as an integrally-formed transmission/reception coil. The transmission/reception coil corresponds to an imaged site of the patient P and may be, for example, a local transmission/reception RF coil such as a head coil.

On the basis of the MR signal output from the reception coil 117, the reception circuitry 119 is configured to generate a digital MR signal (hereinafter, "MR data") under control of the imaging controlling circuitry 121. More specifically, the reception circuitry 119 generates the MR data by performing signal processing processes such as detecting and filtering processes on the MR signal output from the reception coil 117 and subsequently performing an Analog-to-Digital conversion (hereinafter, "A/D conversion") on the data resulting from the signal processing processes. The reception circuitry 119 is configured to output the generated MR data to the imaging controlling circuitry 121. For example, the MR data is generated for each of the coil elements and is output to the imaging controlling circuitry 121 together with a tag identifying the relevant coil element.

The imaging controlling circuitry 121 is configured to perform an imaging process on the patient P, by controlling the gradient power source 105, the transmission circuitry 113, the reception circuitry 119, and the like according to an imaging protocol output from the processing circuitry 131. The imaging protocol includes a pulse sequence corresponding to the type of the medical examination. For example, the imaging protocol defines the following as an imaging parameter corresponding to the pulse sequence: the magnitude of the electric current to be supplied to the gradient coil 103 by the gradient power source 105; the timing with which the electric current is to be supplied to the gradient coil 103 by the gradient power source 105; the magnitude and the time width of the radio frequency pulse to be supplied to the transmission coil 115 by the transmission circuitry 113; the timing with which the radio frequency pulse is to be supplied to the transmission coil 115 by the transmission circuitry 113; the timing with which the MR signal is to be received by the reception coil 117; and the like.

In the following sections, to explain a specific example, it is assumed that the pulse sequence is related to a Short TI Inversion Recovery (STIR) method. The STIR method is a method for obtaining a fat-suppressed image by using the difference in relaxation time (TI) between fat and water caused by an inversion pulse. The pulse sequence related to the STIR method (hereinafter, "STIR sequence") includes a flip pulse related to acquiring the MR signal emitted from the patient P and the inversion pulse applied to the patient P before the flip pulse is applied to the patient P.

The inversion pulse in the present embodiment is applied together with a slice selecting gradient magnetic field, with respect to a slice to which the flip pulse is applied. In other words, the inversion pulse is a pulse related to fat suppression involving the slice selection. In the STIR sequence, when the inversion pulse is applied to the patient P together with the slice selecting gradient magnetic field, the flip pulse is applied to the patient P together with the slice selecting gradient magnetic field, at the time when T1 recovery by the fat is at a null point, i.e., when inversion time (hereinafter, "TI") has elapsed since the application of the inversion pulse. For example, the inversion time is a value obtained by multiplying a fat T1 value, which is dependent on the intensity of the static magnetic field, by 0.7.

For example, the inversion pulse and the flip pulse are each defined by a parameter including an application length or a band of the pulse corresponding to the time width of the pulse and a waveform of the pulse. In other words, each of the parameters related to the inversion pulse and the flip Pulse includes one of the application length and the band of the pulse and may further include the waveform of the pulse. Further, the slice selecting gradient magnetic field is defined by the magnitude of the electric current supplied to the gradient coil used for selecting a slice, i.e., the intensity of the slice selecting gradient magnetic field. According to the STIR method, the application length or the bandwidth of the pulse, the waveform of the pulse, and the intensity of the slice selecting gradient magnetic field are included in the imaging parameter described above. In other words, the imaging parameter includes a plurality of parameters used when the pulse sequence related to the STIR method is executed by the imaging controlling circuitry 121.

Figure 2:
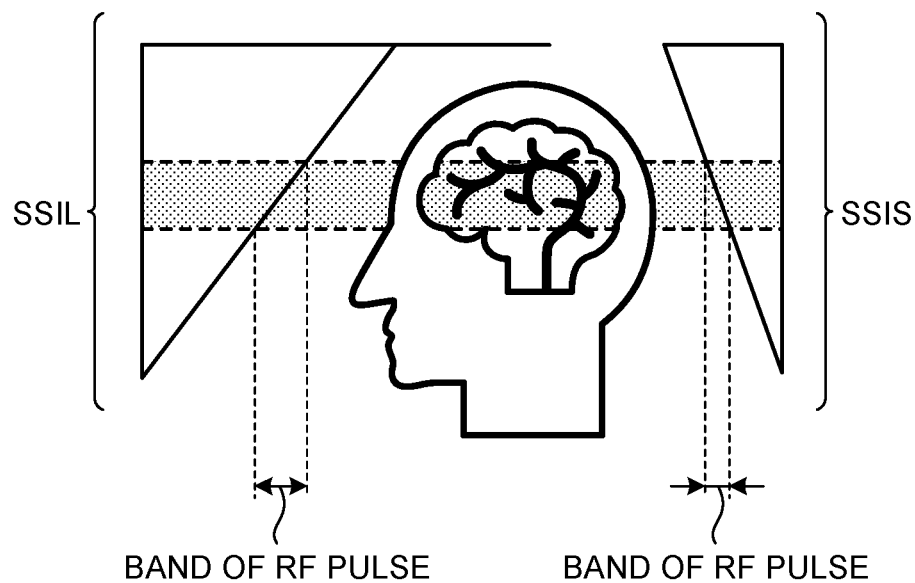
FIG. 2 is a drawing according to the embodiment illustrating an example of a relationship among intensities of a slice selecting gradient magnetic field, slice thicknesses, and bands of RF pulses having mutually the same waveform.

FIG. 2 is a drawing illustrating an example of a relationship among intensities of the slice selecting gradient magnetic field, slice thicknesses, and bands of RF pulses having mutually the same waveform. As illustrated in FIG. 2, when the slice thickness is constant, the wider the band of the RF pulse is, the higher the intensity of the slice selecting gradient magnetic field needs to be. Making the band of the RF pulse wider corresponds to making the application length of the RF pulse shorter.

Conversely, as illustrated in FIG. 2, when the slice thickness is constant, the narrower the band of the RF pulse is, the lower the intensity of the slice selecting gradient magnetic field needs to be. As a result, an intensity SSIS of the slice selecting gradient magnetic field is lower than an intensity SSIL of the slice selecting gradient magnetic field. Making the band of the RF pulse narrower corresponds to making the application length of the RF pulse longer. Accordingly, when excitation using the RF pulse is implemented while the slice thickness is the same, the band of the RF pulse is proportional to the intensity of the slice selecting gradient magnetic field.

When having received the MR data from the reception circuitry 119 as a result of imaging the patient P by driving the gradient power source 105, the transmission circuitry 113, the reception circuitry 119, and the like, the imaging controlling circuitry 121 is configured to transfer the received MR data to the processing circuitry 131. The imaging controlling circuitry 121 is realized by using a processor, for example.

The term "processor" denotes, for example, a Central Processing Unit (CPU), a Graphics Processing Unit (GPU), or circuitry such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]).

As a hardware resource, the system controlling circuitry 123 includes a processor, memory elements such as a Read-Only Memory (ROM), a Random Access Memory (RAM), and/or the like (not illustrated) and is configured to control the MRI apparatus 100 by employing a system controlling function. More specifically, the system controlling circuitry 123 reads a system controlling program stored in a memory, loads the read program into a memory, and controls pieces of circuitry of the MRI apparatus 100 according to the loaded system controlling program.

For example, on the basis of imaging conditions input by the operator via the input interface 127, the system controlling circuitry 123 is configured to read an imaging protocol from the memory 125. The system controlling circuitry 123 is configured to transmit the imaging protocol to the imaging controlling circuitry 121 so as to control the imaging process performed on the patient P. The system controlling circuitry 123 is realized by using a processor, for example. Alternatively, the system controlling circuitry 123 may be incorporated in the processing circuitry 131. In that situation, the system controlling function is executed by the processing circuitry 131, so that the processing circuitry 131 functions as a substitute for the system controlling circuitry 123. Because the processor to realize the system controlling circuitry 123 is the same as described above, the explanations thereof will be omitted.

The memory 125 is configured to store therein various types of programs related to the system controlling function executed by the system controlling circuitry 123, various types of imaging protocols, imaging conditions including a plurality of imaging parameters defining the imaging protocols, and the like. Further, the memory 125 is configured to store therein a determining function 33 and a generating function 35 realized by the processing circuitry 131, in the form of computer-executable programs.

Further, the memory 125 is configured to store therein MR images generated by the generating function 35 and pre-scan images generated by performing pre-scans such as locator scans. Examples of the pre-scan images include a position determining image (which may be called a locator image) used for setting a Field of View (hereinafter "FOV") of a main scan and a coil sensitivity map used for reconstructing an MR image from the main scan. Further, the memory 125 is configured to store therein the FOV that is set in a locator image, which is a pre-scan image. The memory 125 is configured to store therein the imaging parameter determined by the determining function 33. The memory 125 is configured to store therein MR data related to the main scan performed by using the determined imaging parameter and an algorithm used for reconstructing an MR image on the basis of the MR data.

Further, the memory 125 may store therein various types of data received via a communication interface (not illustrated). For example, the memory 125 may store therein information (an imaged site, a medical examination purpose, etc.) related to a medical examination order for the patient P received from an information processing system in a medical institution such as a Radiology information System (RIS).

For example, the memory 125 is realized by using a semiconductor memory element such as a ROM, a RAM, or a flash memory, or a Hard Disk Drive (HDD), a Solid State Drive (SSD), an optical disk, or the like. Alternatively, the memory 125 may be realized by using a Compact Disc (CD)-ROM drive, a Digital Versatile Disc (DVD) drive, or a drive device or the like that reads and writes various types of information from and to a portable storage medium such as a flash memory.

The input interface 127 is configured to receive various types of instructions (e.g., an instruction to turn on the electric power) and inputs of information from the operator. For example, the input interface 127 is realized by using a trackball, a switch button, a mouse, a keyboard, a touchpad on which input operations can be performed by touching an operation surface thereof, a touch screen in which a display screen and a touchpad are integrally formed, contactless input circuitry using an optical sensor, audio input circuitry, and/or the like. The input interface 127 is connected to the processing circuitry 131 and is configured to convert input operations received from the operator into electrical signals and to output the electrical signals to the processing circuitry 131. In the present disclosure, the input interface 127 does not necessarily have to include physical component parts such as the mouse, the keyboard, and/or the like. Possible examples of the input interface 127 include electrical signal processing circuitry configured to receive an electrical signal corresponding to an input operation from an external input device provided separately from the MRI apparatus 100 and to output the electrical signal to controlling circuitry.

Within the pre-scan image displayed on the display device 129, the input interface 127 is configured to input the FOV, according to an instruction from a user. More specifically, within the locator image displayed on the display device 129, the input interface 127 is configured to input the FOV, according to an instruction from the user to set a range. Further, according to an instruction from the user based on the medical examination order, the input interface 127 is configured to input any of various types of imaging parameters related to the main scan.

Under control of either the processing circuitry 131 or the system controlling circuitry 123, the display device 129 is configured to display various types of Graphical User Interfaces (GUIs), the MR images generated by the processing circuitry 131, the pre-scan images such as the locator image, and the like. Further, the display device 129 is configured to display the imaging parameters related to the main scan and the pre-scan, as well as various types of information related to image processing processes. For example, the display device 129 is realized by using a Cathode Ray Tube (CRT) display device, a liquid crystal display device, an organic Electroluminescence (EL) display device, a Light Emitting Diode (LED) display device, a plasma display device, or any other arbitrary display device such as a display apparatus or a monitor known in the relevant technical field.

For example, the processing circuitry 131 is realized by using the processor described above or the like. The processing circuitry 131 includes, among others, the determining function 33 and the generating function 35. The processing circuitry 131 that realizes the determining function 33 and the generating function 35 correspond to a determining unit and a generating unit, respectively. The functions such as the determining function 33 and the generating function 35 are stored in the memory 125 in the form of computer-executable programs. For example, the processing circuitry 131 realizes the functions corresponding to the programs, by reading and executing the programs from the memory 125. In other words, the processing circuitry 131 that has read the programs has the functions such as the determining function 33 and the generating function 35.

In the above description, the example was explained in which the "processor" reads and executes the programs corresponding to the functions from the memory 125; however, possible embodiments are not limited to this example. For example, when the processor is a CPU, the processor realizes the functions by reading and executing the programs saved in the memory 125. In contrast, when the processor is an ASIC, the functions are directly incorporated in the circuitry of the processor as logic circuitry, instead of the programs being saved in the memory 125. Further, the processors according to the present embodiment do not each necessarily have to be structured as a single piece of circuitry. It is also acceptable to structure one processor by combining together a plurality of pieces of independent circuitry so as to realize the functions thereof. Further, although the example was explained in which the single piece of storage circuitry stores therein the programs corresponding to the processing functions, it is also acceptable to arrange a plurality of pieces of storage circuitry in a distributed manner, so that the processing circuitry 131 reads a corresponding program from each of the individual pieces of storage circuitry.

By employing the determining function 33 and on the basis of one or both of: a parameter of one of the inversion and flip pulses related to applying the one of the pulses; and the intensity of the slice selecting gradient magnetic field applied together with the one of the pulses in relation to selecting the slice to which the one of the pulses is applied, the processing circuitry 131 is configured to determine one or both of: a parameter related to applying the other of the inversion and flip pulses; and the intensity of the slice selecting gradient magnetic field applied together with the other of the pulses in relation to selecting the slice to which the other of the pulses is applied.

For example, by employing the determining function 33, the processing circuitry 131 is configured to determine one or both of: the parameter of the other of the pulses; and the intensity of the slice selecting gradient magnetic field applied together with the other of the pulses, so as to diminish the difference between the position excited by the inversion pulse and the position excited by the flip pulse. In other words, the determining function 33 is configured to determine one or both of the parameter of the other of the Pulses and the intensity of the slice selecting gradient magnetic field applied together with the other of the pulses, so as to align the position excited by the inversion pulse with the position excited by the flip pulse.

In the following sections, to explain a specific example, it is assumed that the determining function 33 is configured, on the basis of one or both of: a parameter (hereinafter, "first parameter") related to the flip pulse serving as the parameter of the one of the pulses described above; and the intensity (hereinafter, "first slice magnetic field intensity") of the slice selecting gradient magnetic field applied together with the flip pulse, to determine one or both of: a parameter (hereinafter, "second parameter") related to the inversion pulse serving as the parameter of the other of the pulses; and the intensity (hereinafter, "second slice magnetic field intensity") of the slice selecting gradient magnetic field applied together with the inversion pulse. The process (hereinafter, "determining process") of determining one or both of the second parameter and the second slice magnetic field intensity on the basis of one or both of the first parameter and the first slice magnetic field intensity will be explained later.

Figure 3:
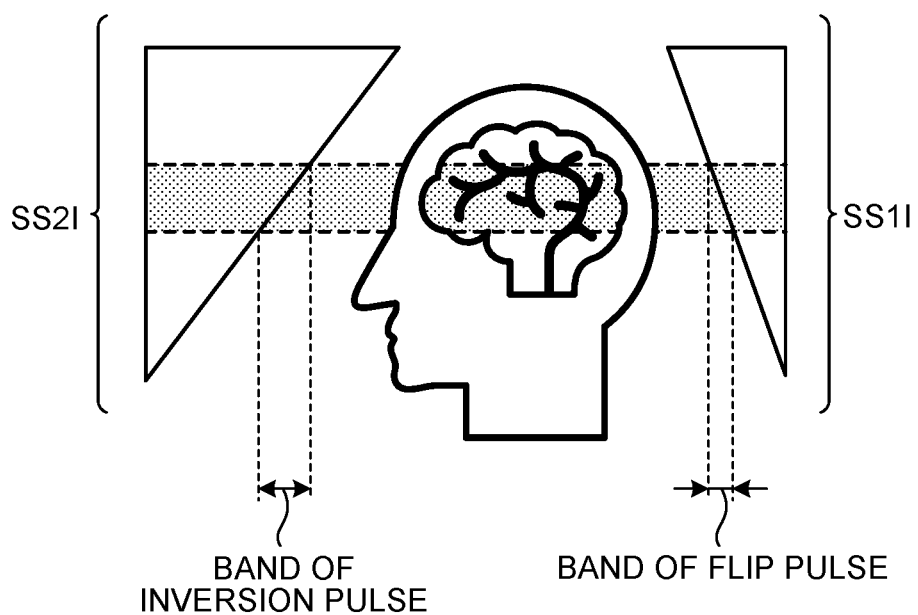
FIG. 3 is a conceptual drawing illustrating an example of a relationship among intensities of first and second slice selecting gradient magnetic fields, a constant slice thickness, bands of an inversion pulse, and bands of a flip pulse, as a comparison example where no determining process according to the embodiment is performed.

FIG. 3 is a conceptual drawing illustrating an example of a relationship among intensities SS1I of the first slice selecting gradient magnetic field, intensities SS2I of the second slice selecting gradient magnetic field, a constant slice thickness, bands of the flip pulse, and bands of the inversion pulse, as a comparison example where no determining process is performed. As illustrated in FIG. 3, when the slice thickness is constant, the wider the band of the inversion pulse is, the higher is the intensity SS2I of the second slice selecting gradient magnetic field. Making the band of the inversion pulse wider corresponds to making the application length of the inversion pulse shorter.

Further, as illustrated in FIG. 3, when the slice thickness is constant, the narrower the band of the flip pulse is, the lower is the intensity SS1I of the first slice selecting gradient magnetic field. Making the band of the flip pulse narrower corresponds to making the application length of the flip pulse longer.

Figure 4:
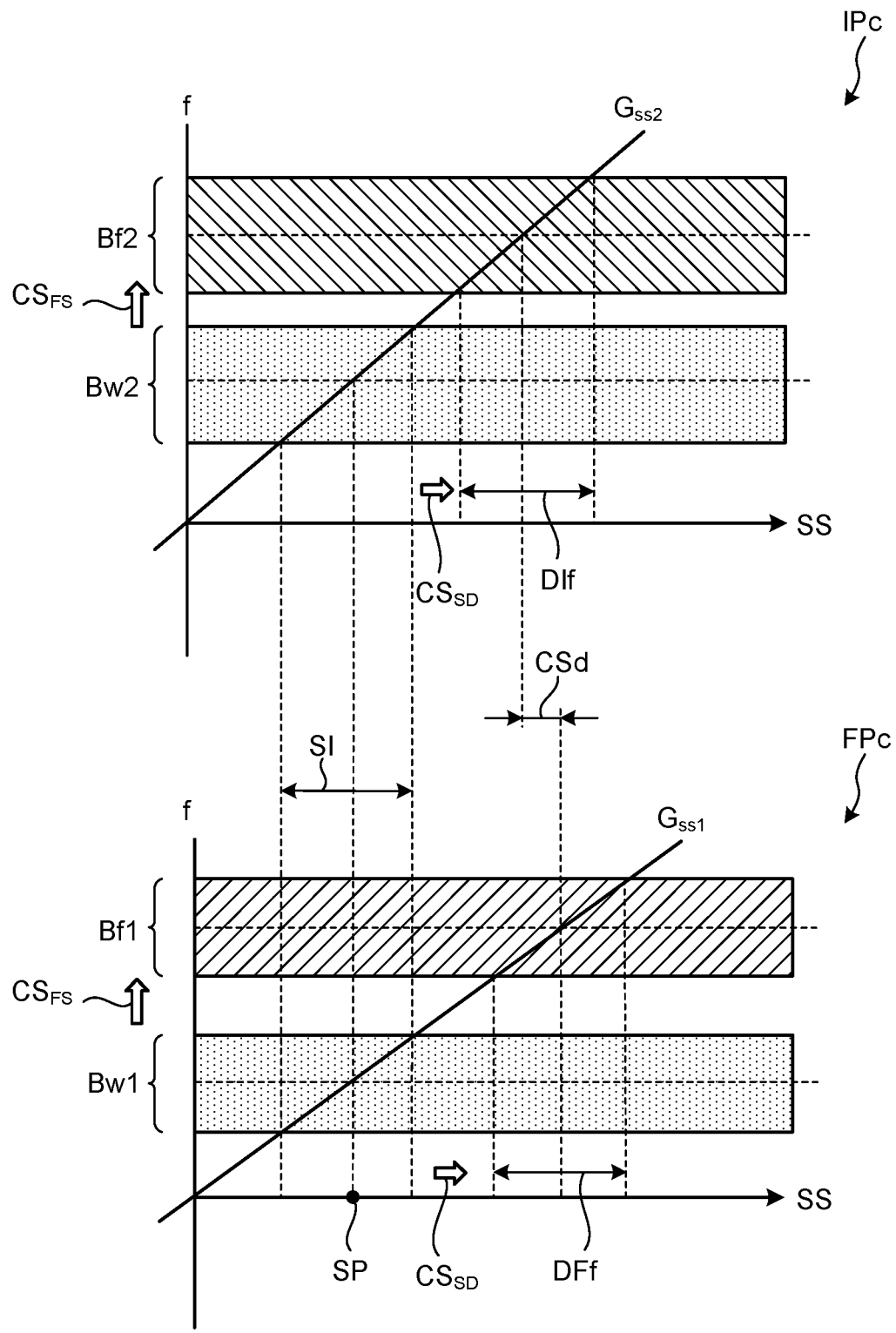
FIG. 4 is a drawing illustrating examples of an inversion pulse and a flip pulse with respect to chemical shifts in a slice direction in the example in FIG. 3.

FIG. 4 is a drawing illustrating examples of the inversion pulse and the flip pulse with respect to chemical shifts in the slice direction in the example in FIG. 3. The graph IPc in FIG. 4 indicates a chemical shift in the slice direction with respect to the inversion pulse. Further, the graph FPc in FIG. 4 indicates a chemical shift in the slice direction with respect to the flip pulse. The horizontal axes in the graph IPc and the graph FPc express positions SS in the slice direction relative to a reference. Further, the vertical axes in the graph IPc and the graph FPc express frequencies f. As illustrated in FIG. 4, with respect to a slice SI to which the inversion pulse and the flip pulse are applied, the slice position SP and the slice thickness are mutually the same. In the slice SI illustrated in FIG. 4, water is excited by the inversion pulse and the flip pulse.

Further, as illustrated in FIG. 4, for example, the first slice magnetic field intensity $G_{ss1}$ is lower than the second slice magnetic field intensity $G_{ss2}$. In other words, the slope of the slice selecting gradient magnetic field (the second slice magnetic field intensity $G_{ss2}$) applied together with the inversion pulse is larger than the slope of the slice selecting gradient magnetic field (the first slice magnetic field intensity $G_{ss1}$) applied together with the flip Pulse. In that situation, as illustrated in FIGS. 3 and 4, the band Bw1 of the flip pulse is narrower than the band Bw2 of the inversion pulse. The band Bw1 of the flip pulse and the band Bw2 of the inversion pulse indicate frequency bands with respect to water components.

As illustrated in FIG. 4, because the resonance frequency of water is different from the resonance frequency of fat, for the fat components, a chemical shift $C_{FS}$ occurs along the frequency direction. The band Bf1 of the flip pulse is a band obtained when the band Bw1 of the flip pulse has shifted in the frequency direction by an amount corresponding to the chemical shift $CS_{FS}$. In FIG. 4, the band Bf1 of the flip pulse virtually indicates the frequency band of the flip pulse with respect to the fat components. In FIG. 4, it does not mean that the flip pulse is applied twice in the band Bw1 and in the band Bf1. Rather, FIG. 4 illustrates how the flip pulse is applied to the water components and to the fat components during the application of the flip pulse at one time. Further, in FIG. 4, the band Bf2 of the inversion pulse is a band obtained when the band Bw2 of the inversion pulse has shifted in the frequency direction by an amount corresponding to the chemical shift $CS_{FS}$. The band Bf2 of the inversion pulse virtually indicates the frequency band of the inversion pulse with respect to the fat components. In FIG. 4, it does not mean that the flip pulse is applied twice in the band Bw2 and in the band Bf2. Rather, FIG. 4 illustrates how the flip pulse is applied to the water components and to the fat components during the application of the flip pulse at one time.

As illustrated in FIG. 4, the band Bf2 of the inversion pulse is wider than the band Bf1 of the flip pulse. Accordingly, the second slice magnetic field intensity $G_{ss2}$ and the first slice magnetic field intensity $G_{ss1}$ are different from each other. For this reason, as illustrated in FIG. 4, the chemical shift $CS_{SD}$ of the inversion pulse in the slice direction and the chemical shift $CS_{SD}$ of the flip pulse in the slice direction have mutually-different shift amounts. As a result, the range DIf in the slice direction in which the fat components are excited by the inversion pulse is different from the range DFf in the slice direction in which the fat components are excited by the flip pulse. In FIG. 4, the size of the range DIf and the size of the range DFf are the same as each other.

To make it easier to understand, the chemical shift $CS_{SD}$ is exaggerated in FIG. 4. The present embodiment is not limited to the example illustrated in FIG. 4.

As illustrated in FIG. 4, the lower the intensity of the slice selecting magnetic field is (i.e., the smaller the slope of the slice selecting magnetic field in the slice direction is), the larger is the shift amount of the chemical shift in the slice direction. Accordingly, when the first slice magnetic field intensity $G_{ss1}$ and the second slice magnetic field intensity $G_{ss2}$ are different from each other, as illustrated in FIG. 4, the range DIf and the range DFf are different from each other in the slice direction by a difference amount CSd. In other words, in the situation illustrated in FIG. 4, the position in which the fat is excited by the inversion pulse is different from the position in which the fat is excited by the flip pulse, by the difference amount CSd.

Figure 5:
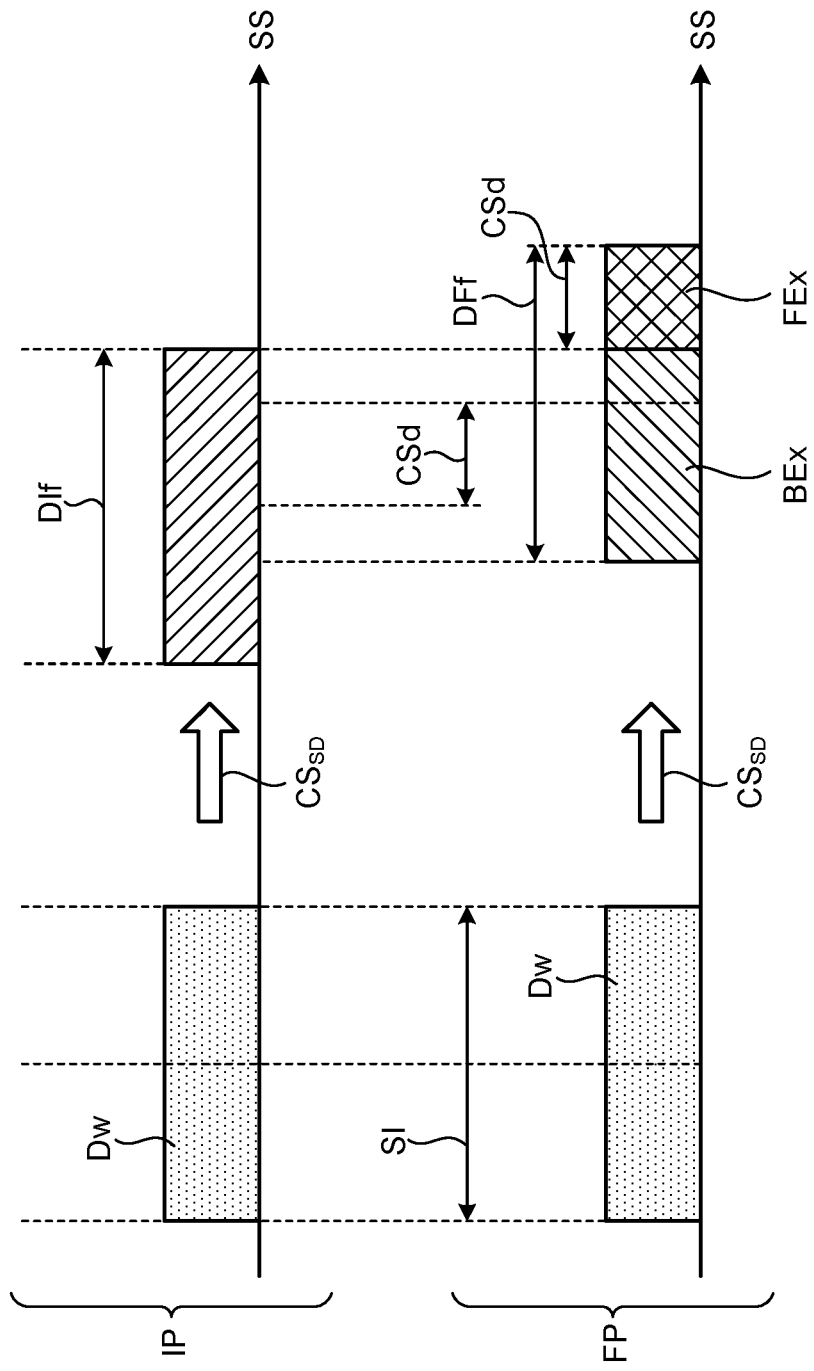
FIG. 5 is a drawing illustrating an example of a difference amount of the chemical shifts in the slice direction between the inversion pulse and the flip pulse, in relation to FIGS. 3 and 4.

FIG. 5 is a drawing illustrating the difference amount CSd between the range DIf and the range DFf, in relation to FIGS. 3 and 4. The reference characters "IP" in FIG. 5 indicate the range Dw, in the slice direction, of the water excited by the application of the inversion pulse to the slice SI and the range DIf, in the slice direction, of the fat excited by the application of the inversion pulse. Further, the reference characters "FP" in FIG. 5 indicate the range Dw, in the slice direction, of the water excited by the application of the flip pulse to the slice SI and the range DFf, in the slice direction, of the fat excited by the application of the flip pulse.

The region BEx in FIG. 5 indicates a region in the slice direction excited by both the inversion pulse and the flip Pulse. In the region BEx, the MR signal of the fat is suppressed because the flip pulse is applied when the time TI has elapsed since the application of the inversion pulse. In this situation, the time TI may be defined by a time period with which the MR signal of the fat becomes null, for example; however, the time TI is not limited to this example.

As illustrated in FIGS. 4 and 5, when the waveforms (e.g., the bands) are significantly different between the inversion pulse and the flip pulse, the chemical shift in the slice direction with respect to the fat components is not negligible. For example, the region FEx in FIG. 5 indicates a region in the slice direction that is not excited by the inversion pulse but is excited by the flip pulse for the first time. In other words, in the region FEx, no excitation is made by the inversion pulse. For this reason, even when the flip pulse is applied when the time TI has elapsed since the application of the inversion pulse, the MR signal of the fat in the region FEx is not suppressed unlike in the region BEx. As a result, a fat suppression defect and/or fat suppression unevenness may occur.

In other words, in relation to STIR with respect to mutually the same slice, because the first slice magnetic field intensity $G_{ss1}$ is different from the second slice magnetic field intensity $G_{ss2}$ (i.e., because the bands are different between the inversion pulse and the flip pulse), there is a possibility that image quality degradation may occur, such as a fat suppression defect and/or a change in the null point. In the determining process, an imaging parameter is determined so as to inhibit the image quality degradation.

By employing the generating function 35, the processing circuitry 131 is configured to obtain, from the reception circuitry 119, the MR data (hereinafter, "pre-scan data") generated by performing the pre-scan on the patient P, to arrange the obtained pre-scan data in a k-space, and to generate a pre-scan image on the basis of the pre-scan data arranged in the k-space. The generating function 35 is configured to store the generated pre-scan image (the locator image or the sensitivity map) into the memory 125. The generating function 35 is configured to generate the MR image (hereinafter, "main scan image") on the basis of the MR data acquired by performing the main scan using the STIR method. To generate the main scan image, the sensitivity map may be used. Because it is possible to use an existing reconstruction method, the explanation thereof will be omitted.

Figure 6:
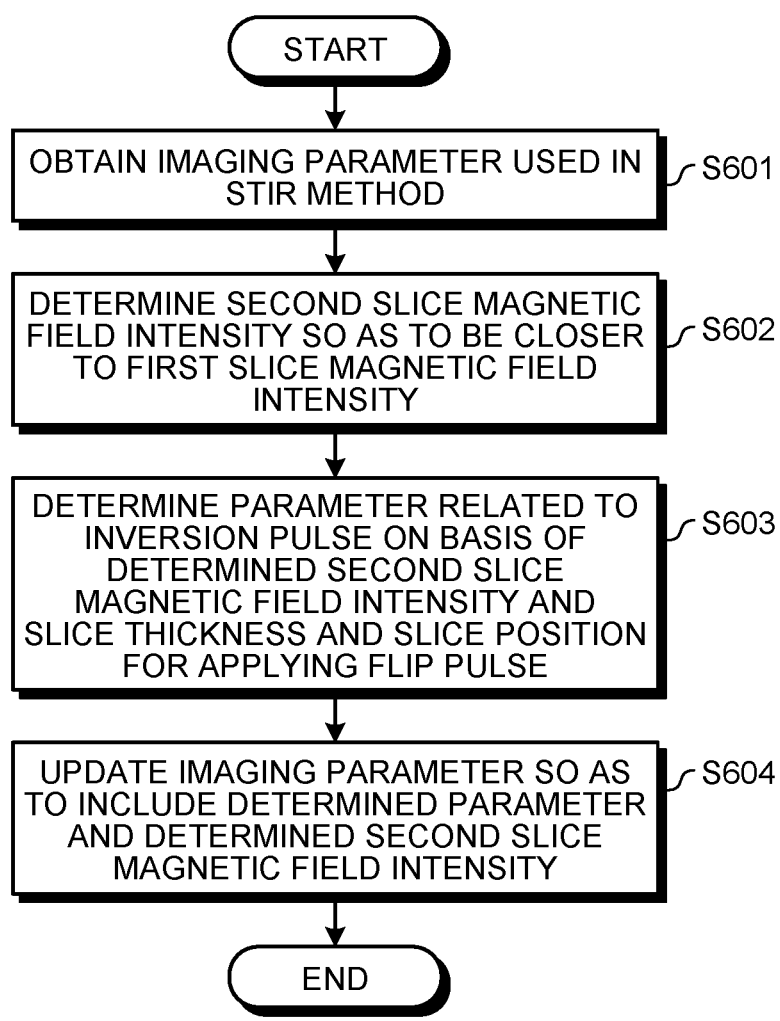
FIG. 6 is a flowchart illustrating an example of a procedure in a determining process according to the embodiment.

The determining process performed by the MRI apparatus 100 according to the present embodiment configured as described above will be explained with reference to FIGS. 6 to 8. FIG. 6 is a flowchart illustrating an example of a procedure in the determining process. In the present embodiment, when the first slice magnetic field intensity $G_{ss1}$ and the second slice magnetic field intensity $G_{ss2}$ is the same, the determining process will not be performed.

The Determining Process

Step S601:

By employing the determining function 33, the processing circuitry 131 obtains an imaging parameter related to a STIR pulse sequence used in the main scan performed on the patient P. The imaging parameter is set in advance in accordance with a medical examination order, so as to realize imaging conditions such as a slice position, a slice thickness, and a flip angle related to the STIR method. Alternatively, the imaging parameter may be obtained by an obtaining function additionally provided in the processing circuitry 131.

Step S602:

By employing the determining function 33, the processing circuitry 131 makes the second slice magnetic field intensity $G_{ss2}$ closer to the first slice magnetic field intensity $G_{ss1}$. For example, when the first slice magnetic field intensity $G_{ss1}$ and the second slice magnetic field intensity $G_{ss2}$ in the obtained imaging parameter are those illustrated in FIGS. 3 and 4, the determining function 33 makes the second slice magnetic field intensity $G_{ss2}$ closer to the first slice magnetic field intensity $G_{ss1}$. As a result, the intensity of the slice selecting gradient magnetic field applied together with the inversion pulse becomes closer to the intensity of the slice selecting gradient magnetic field applied together with the flip pulse. In other words, as a result of the process at the present step, the slope indicating the slice selecting gradient magnetic field in the graph IPc becomes closer to the slope indicating the slice selecting gradient magnetic field in the graph FPc. The determining function 33 determines the second slice magnetic field intensity $G_{ss2}$ so as to be closer to the first slice magnetic field intensity $G_{ss1}$. In this situation, the process performed by the determining function 33 to make the second slice magnetic field intensity $G_{ss2}$ closer to the first slice magnetic field intensity $G_{ss1}$ includes: a process of making the second slice magnetic field intensity $G_{ss2}$ equal to the first slice magnetic field intensity $G_{ss1}$; and a process of decreasing the difference between the second slice magnetic field intensity $G_{ss2}$ and the first slice magnetic field intensity $G_{ss1}$ even though the two intensities may not be equal to each other.

Step S603:

By employing the determining function 33, the processing circuitry 131 determines the parameter of the waveform related to the inversion pulse, on the basis of the region FEx, the second slice magnetic field intensity $G_{ss2}$ made closer to the first slice magnetic field intensity $G_{ss1}$, and the slice thickness and the slice position SP for applying the flip pulse. The parameter of the waveform may be, for example, a parameter related to the shape of an envelope of the inversion pulse. More specifically, the determining function 33 determines a band of the inversion pulse on the basis of the determined second slice magnetic field intensity $G_{ss2}$ and the slice thickness and the slice position SP for applying the flip pulse. Subsequently, on the basis of the determined band of the inversion pulse, the determining function 33 determines the application length of the inversion pulse. For example, the determining function 33 determines the band of the inversion pulse so as to be closer to the band of the flip pulse. In other words, the determining function 33 determines the application length of the inversion pulse so as to be closer to the application length of the flip pulse. In this situation, the process of making one of the band and the application length of the inversion pulse closer to one of the band and the application length of the flip pulse includes: a process of making the one of the band and the application length of the inversion pulse equal to the one of the band and the application length of the flip pulse; and a process of decreasing the difference between the one of the band and the application length of the inversion pulse and the one of the band and the application length of the flip pulse even though the two may not be equal to each other.

Alternatively, the determining function 33 may determine the application length of the inversion pulse on the basis of the determined second slice magnetic field intensity $G_{ss2}$ and the slice thickness and the slice position SP for applying the flip pulse. In other words, the determining function 33 may determine a band and an application length of the inversion pulse adjusted on the basis of the determined second slice magnetic field intensity $G_{ss2}$ and the slice thickness and the slice position SP for applying the flip pulse, as a new parameter related to the inversion pulse. Further, although FIG. 4 illustrates the example in which the band Bw1 of the flip pulse is narrower than the band Bw2 of the inversion pulse, the determining process is also applicable to the situation where the band Bw1 of the flip pulse is wider than the band Bw2 of the inversion pulse.

Step S604:

With respect to the imaging parameter, by employing the determining function 33, the processing circuitry 131 updates the parameter of the inversion pulse in the imaging parameter with the determined parameter of the inversion pulse. Further, with respect to the imaging parameter, the determining function 33 updates the second slice magnetic field intensity $G_{ss2}$ with the determined second slice magnetic field intensity $G_{ss2}$. As a result, the determining function 33 has updated the imaging parameter so as to include the determined parameter and the second slice magnetic field intensity. The determining process has thus been completed. After the determining process is completed, the imaging controlling circuitry 121 performs the main scan according to the STIR method, by using the updated imaging parameter.

Figure 7:
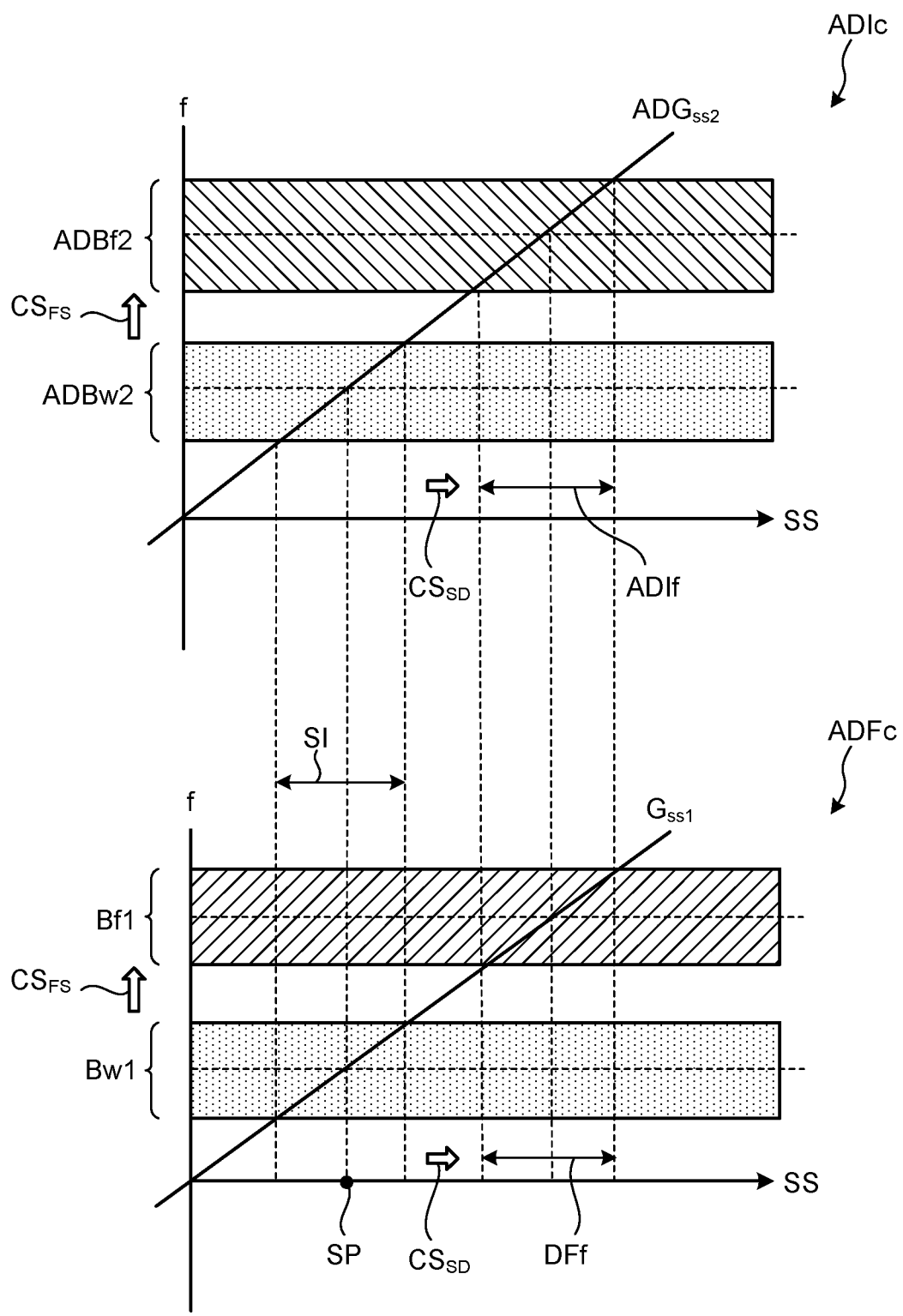
FIG. 7 is a drawing according to the embodiment illustrating examples of an inversion pulse and a flip pulse with respect to chemical shifts in the slice direction after the determining process.

FIG. 7 is a drawing illustrating examples of the inversion pulse and the flip pulse with respect to chemical shifts in the slice direction after the determining process. The graph ADIc in FIG. 7 indicates a chemical shift along the slice direction with respect to the inversion pulse. Further, the graph ADFc in FIG. 7 indicates a chemical shift along the slice direction with respect to the flip pulse. The horizontal axes in the graph ADIc and the graph ADFc express positions SS in the slice direction relative to a reference. Further, the vertical axes in the graph ADIc and the graph ADFc express frequencies f. As illustrated in FIG. 7, with respect to the slice SI to which the inversion pulse and the flip pulse are applied, the slice position SP and the slice thickness are mutually the same.

As illustrated in FIG. 7, because the resonance frequency of water is different from the resonance frequency of fat, for the fat components, a chemical shift $CS_{FS}$ occurs along the frequency direction. The band Bf1 of the flip pulse is a band obtained when the band Bw1 of the flip pulse has shifted in the frequency direction by an amount corresponding to the chemical shift $CS_{FS}$. In FIG. 7, the band Bf1 of the flip pulse virtually indicates the frequency band of the flip pulse with respect to the fat components. In FIG. 7, it does not mean that the flip pulse is applied twice in the band Bw1 and in the band Bf1. Rather, FIG. 7 illustrates how the flip pulse is applied to the water components and to the fat components during the application of the flip pulse at one time. Further, in FIG. 7, the band ADBf2 of the inversion pulse is a band obtained when the band ADBw2 of the inversion pulse has shifted in the frequency direction by an amount corresponding to the chemical shift $CS_{FS}$. The band ADBf2 of the inversion pulse virtually indicates the frequency band of the inversion pulse with respect to the fat components. In FIG. 7, it does not mean that the flip pulse is applied twice in the band ADBw2 and in the band ADBf2. Rather, FIG. 7 illustrates how the flip pulse is applied to the water components and to the fat components during the application of the flip pulse at one time.

As illustrated in FIG. 7, for example, the center frequency and the band width are equal between the band Bf1 of the flip pulse and the band ADBf2 of the post-determining-process inversion pulse. Also, the first slice magnetic field intensity $G_{ss1}$ is equal to the post-determining-process second slice magnetic field intensity $ADG_{ss2}$. Accordingly, as illustrated in FIG. 7, the range ADIf in the slice direction where the fat components are excited by the post-determining-process inversion pulse is the same range as the range DFf.

In other words, as illustrated in FIG. 7, the range ADIf overlaps with the range DFf. That is to say, after the determining process, the difference amount CSd explained with reference to FIG. 4 is resolved, as observed in FIG. 7. More specifically, as illustrated in FIG. 7, the position in which the fat is excited by the post-determining-process inversion Pulse is the same as the position in which the fat is excited by the flip pulse.

With the processes at steps S602 and S603, as illustrated in FIG. 7, the processing circuitry 131 determines, by employing the determining function 33, the imaging parameter of the pulse sequence related to the STIR method, so as to diminish the difference in the slice direction between the position excited by the inversion pulse and the position excited by the flip pulse (in other words, so as to reduce the difference amount Csd), i.e., so as to align the position excited by the inversion pulse with the position excited by the flip pulse.

To make it easier to understand, the chemical shift $CS_{SD}$ is exaggerated in FIG. 7. The present embodiment is not limited to the example illustrated in FIG. 7.

Figure 8:
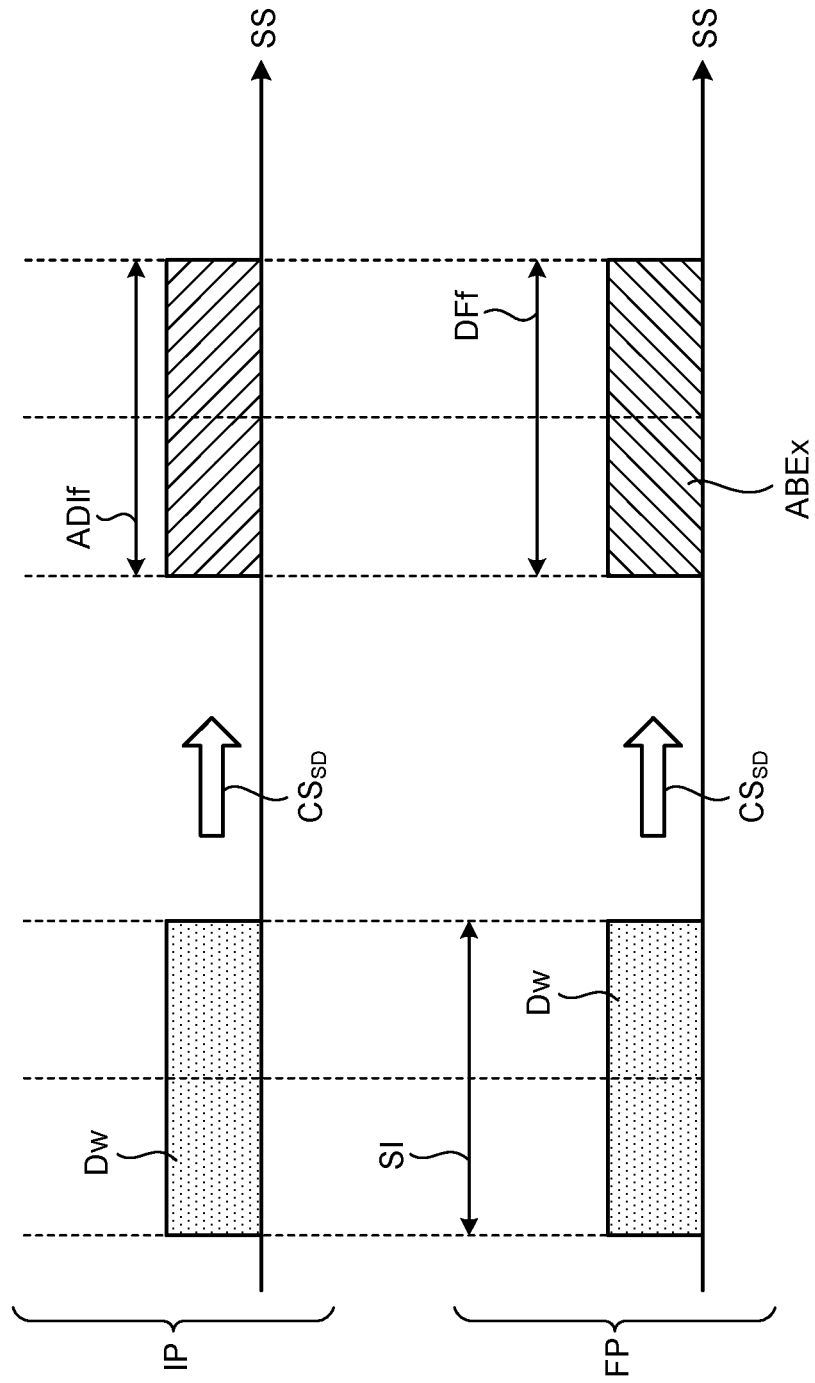
FIG. 8 is a drawing according to the embodiment illustrating an example of a relationship of slice positions excited by a post-determining-process inversion pulse and a flip pulse, in relation to FIG. 7.

FIG. 8 is a drawing illustrating a positional relationship between the range ADif and the range DFf in relation to FIG. 7. The reference characters "IP" in FIG. 8 indicate the range Dw, in the slice direction, of the water excited by the application of the inversion pulse to the slice SI and the range ADIf, in the slice direction, of the fat excited by the application of the post-determining-process inversion pulse. Further, the reference character "FP" in FIG. 8 indicate the range Dw, in the slice direction, of the water excited by the application of the flip pulse to the slice SI and the range DFf, in the slice direction, of the fat excited by the application of the flip pulse.

The region ABEx in FIG. 8 indicates a region in the slice direction excited by both the post-determining-process inversion pulse and the flip pulse. In the region ABEx, the MR signal of the fat is suppressed because the flip pulse is applied when the time TI has elapsed since the application of the post-determining-process inversion pulse. Consequently, according to the present embodiment, it is possible to reduce impacts on the image quality of the image generated by implementing the STIR method.

In the present embodiment, the second slice magnetic field intensity $G_{ss2}$ is made closer to the first slice magnetic field intensity $G_{ss1}$, so that the parameter (e.g., the application length) of the inversion pulse is determined on the basis of the second slice magnetic field intensity $G_{ss2}$ that was made closer; however, possible processing procedures of the determining process are not limited to the procedure in this example. For instance, in a modification example of the present embodiment, by employing the determining function 33, the processing circuitry 131 may make the first slice magnetic field intensity $G_{ss1}$ closer to the second slice magnetic field intensity $G_{ss2}$, so that the parameter (e.g., the application length) of the flip pulse is determined on the basis of the first slice magnetic field intensity $G_{ss1}$ that was made closer.

The MRI apparatus 100 according to the embodiment described above is configured, on the basis of one or both of (A) the parameter related to applying one of the inversion and flip pulses and (B) the intensity of the slice selecting gradient magnetic field applied together with the one of the pulses in relation to selecting the slice to which the one of the pulses is applied, to determine one or both of (A) the parameter related to applying the other of the inversion and flip pulses and (B) the intensity of the slice selecting gradient magnetic field applied together with the other of the pulses in relation to selecting the slice to which the other of the pulses is applied. For example, the MRI apparatus 100 described herein is configured to determine the one or both of the parameter of the other of the pulses and the intensity of the slice selecting gradient magnetic field applied together with the other of the pulses, so as to diminish the difference (the difference amount CSd) between the position excited by the inversion pulse and the position excited by the flip pulse.

More specifically, the MRI apparatus 100 according to the present embodiment is configured to determine the one or both of the parameter of the other of the pulses and the intensity of the slice selecting gradient magnetic field applied together with the other of the pulses, so as to align the position excited by the inversion pulse with the position excited by the flip pulse. Even more specifically, the MRI apparatus 100 is configured to determine the one or both of (A) the parameter related to the inversion pulse serving as the parameter of the other of the pulses and (B) the intensity of the slice selecting gradient magnetic field applied together with the inversion pulse, on the basis of one or both of (A) the parameter related to the flip pulse serving as the parameter of the one of the pulses and (B) the intensity of the slice selecting gradient magnetic field applied together with the flip pulse.

Consequently, by using the MRI apparatus 100 according to the present embodiment, as illustrated in FIGS. 7 and 8, by adjusting the imaging parameter based on the intensity of the slice selecting gradient magnetic field or the like, it is possible, with regard to the chemical shifts in the slice direction, to automatically adjust the position in which the fat is excited by the inversion pulse and the position in which the fat is excited by the flip pulse. In other words, by using the MRI apparatus 100 described herein, before implementing the STIR method that uses the inversion pulse involving the application of the slice selecting gradient magnetic field, it is possible to cause the position in which the fat is excited by the inversion pulse to be aligned with (to match) the position in which the fat is excited by the flip pulse, on the basis of the imaging parameter set in the imaging conditions in advance. In other words, in conjunction with the parameter of the flip pulse (the RF pulse) set in the imaging conditions, it is possible to adjust the band (the application length) of the inversion pulse, so as to make the chemical shift amounts in the slice direction equal or similar to each other.

As explained above, by using the MRI apparatus 100 described herein, between the inversion pulse and the flip pulse, it is possible to reduce the difference in the slice selecting position of the fat components caused by the chemical shifts along the slice direction and to thus improve fat suppression unevenness in the regions where magnetic fields are not uniform and fluctuation of the TI with which the T1 recovery of the fat becomes null. As a result, when using the MRI apparatus 100 described herein, the user is able to select the flip pulse (an imaging pulse) as appropriate, without being conscious about changes in the extent to which the fat is suppressed. In addition, the MRI apparatus 100 described herein is not easily impacted by non-uniformity of the static magnetic fields and is capable of reducing fat suppression defects that may occur off center. It is therefore possible to achieve more stable image quality regarding the MR image generated by implementing the STIR method.

A Modification Example

In the embodiment described above, step S603 is performed after step S602; however, the present embodiment is not limited to this example. In the following sections, a determining process according to the present modification example will be explained with reference to FIG. 9.

Figure 9:
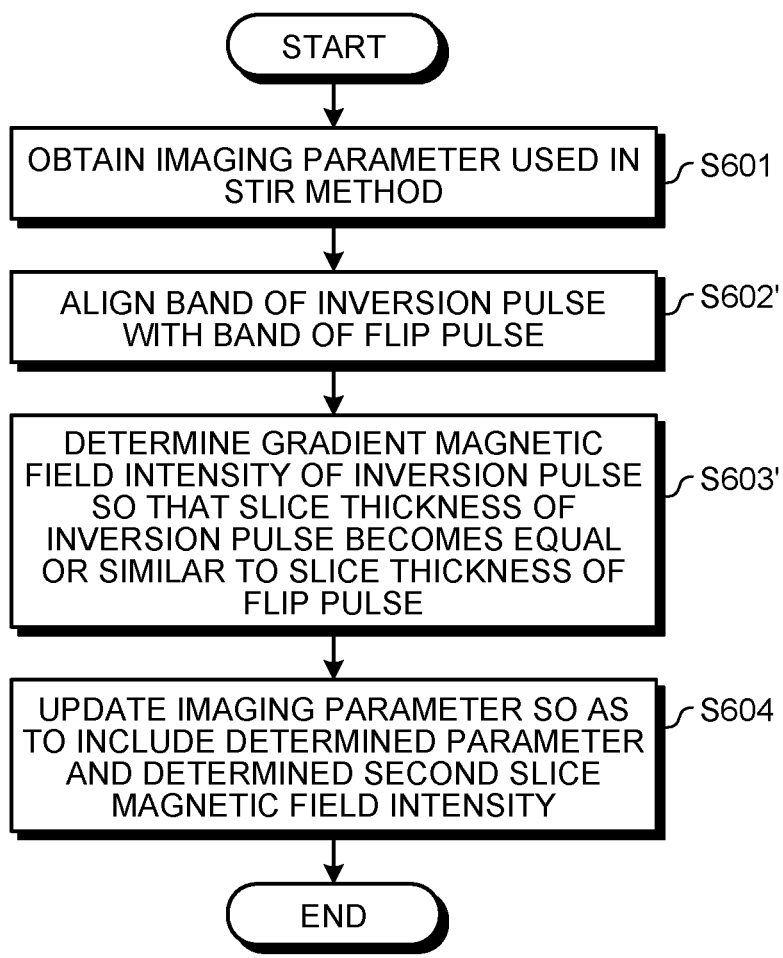
FIG. 9 is a flowchart illustrating an example of a procedure in a determining process according to a modification example of the embodiment.

FIG. 9 is a flowchart illustrating an example of a procedure in the determining process according to the present modification example. As illustrated in FIG. 9, because steps S601 and S604 are the same as those in the flowchart in FIG. 6, the explanations thereof will be omitted.

Step S602':

By employing the determining function 33, the processing circuitry 131 determines the parameter of the waveform related to the inversion pulse, so as to align the band of the inversion pulse with the band of the flip pulse. As a result, the band of the inversion pulse is aligned with the band of the flip pulse. In this situation, the determining function 33 may cause the band of the inversion pulse to be aligned with the band of the flip pulse so that the bands completely match each other or may align the band of the inversion pulse so as to be closer to the band of the flip pulse even though the bands may not completely match each other.

Step S603':

By employing the determining function 33, the processing circuitry 131 determines the gradient magnetic field intensity $G_{ss2}$ of the inversion pulse so that the slice thicknesses are equal or similar to each other between the inversion pulse and the flip pulse. In other words, the determining function 33 determines the second slice magnetic field intensity $G_{ss2}$ so as to make the second slice magnetic field intensity $G_{ss2}$ closer to the first slice magnetic field intensity $G_{ss1}$. Subsequently, the process at step S604 is performed. Because advantageous effects of the present modification example are the same as those of the embodiment, the explanations thereof will be omitted. Alternatively, at step S602', it is also acceptable to align the band of the flip pulse with the band of the inversion pulse, so that, at step S603', the first slice magnetic field intensity $G_{ss1}$ is made closer to the second slice magnetic field intensity $G_{ss2}$.

An Application Example

In the present application example, the image quality of an MR image generated by using the STIR method is further stabilized. In the present application example, by employing the determining function 33, the processing circuitry 131 at first determines the second slice magnetic field intensity $ADG_{ss2}$ so as to be closer to the first slice magnetic field intensity $G_{ss1}$. Because the process of determining the second slice magnetic field intensity $ADG_{ss2}$ is the same as that in the embodiment, the explanations thereof will be omitted.

Subsequently, the determining function 33 determines the Parameter of the inversion pulse so that the slice thickness related to applying the inversion pulse includes the slice thickness related to applying the flip pulse. In other words, as a result of the present application example, the intensity (the slope) of the slice selecting gradient magnetic field is caused to be equal or similar between the inversion pulse and the flip pulse, so that the inversion pulse is applied to a slice thicker than the slice to which the flip pulse is applied. As a result, according to the present application example, the band of the inversion pulse is different from the band of the flip pulse. The band of the inversion pulse is wider than the band of the flip pulse. In the following sections, the parameter determined in relation to the present application example will be explained with reference to FIG. 10.

Figure 10:
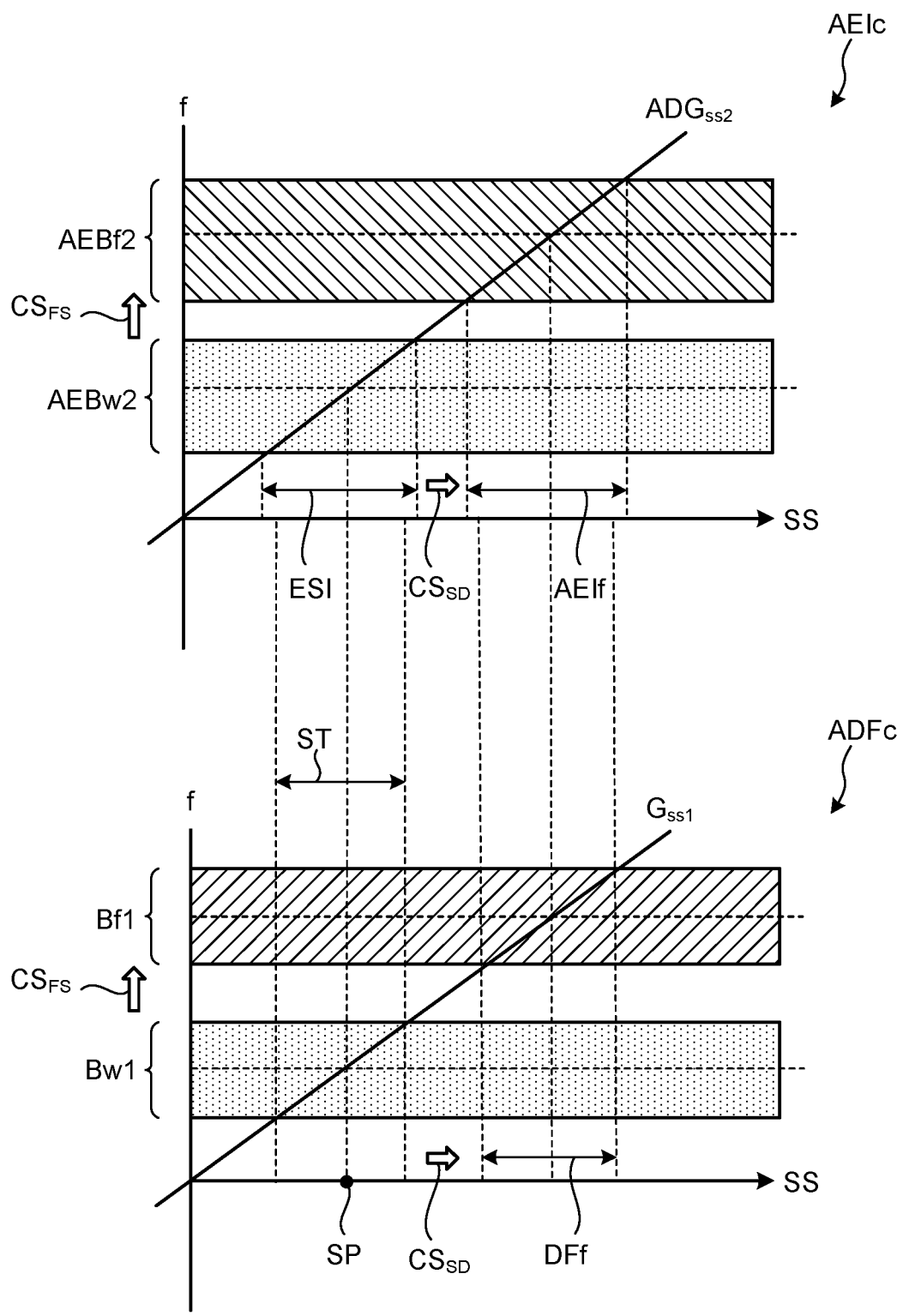
FIG. 10 is a drawing according to an application example of the embodiment illustrating examples of an inversion pulse and a flip pulse, with respect to chemical shifts in the slice direction after the determining process.

FIG. 10 is a drawing illustrating examples of the inversion pulse and the flip pulse, with respect to the chemical shifts in the slice direction after the determining process. The graph AEIc in FIG. 10 indicates a chemical shift along the slice direction with respect to the inversion pulse, the band of the inversion pulse determined by the determining process, and a slice thickness ESI to which the inversion pulse is applied. Further, the graph ADFc in FIG. 10 indicates a chemical shift along the slice direction with respect to the flip pulse.

The horizontal axes in the graph ADIc and the graph ADFc in FIG. 10 express positions SS in the slice direction relative to a reference. Further, the vertical axes in the graph ADIc and the graph ADFc express frequencies f. The reference characters "ST" in FIG. 10 indicate the slice thickness of the slice to which the flip pulse is applied. As illustrated in FIG. 10, the slice thickness ESI to which the inversion pulse is applied is larger than the slice thickness ST to which the flip pulse is applied.

As illustrated in FIG. 10, by employing the determining function 33, the processing circuitry 131 determines the band AEBw2 of the inversion pulse, i.e., the application length of the inversion pulse, so that the slice thickness ESI related to applying the inversion pulse includes the slice thickness ST related to applying the flip pulse. In other words, the determining function 33 determines the band that includes the band Bw1 of the flip pulse and is wider than the band Bw1 of the flip pulse, as the band AEBw2 of the inversion pulse. That is to say, the determining function 33 determines the parameter (one of the band and the application length) of the inversion pulse so that the slice thickness to which the inversion pulse is applied is larger than the band ADBw2 of the inversion pulse illustrated in FIG. 7.

As illustrated in FIG. 10, because the resonance frequency of water is different from the resonance frequency of fat, for the fat components, a chemical shift $CS_{FS}$ occurs along the frequency direction. The band Bf1 of the flip pulse is a band obtained when the band Bw1 of the flip pulse has shifted in the frequency direction by an amount corresponding to the chemical shift $CS_{FS}$. In FIG. 10, the band Bf1 of the flip pulse virtually indicates the frequency band of the flip pulse with respect to the fat components. In FIG. 10, it does not mean that the flip pulse is applied twice in the band Bw1 and in the band Bf1. Rather, FIG. 10 illustrates how the flip pulse is applied to the water components and to the fat components during the application of the flip pulse at one time.

Further, in FIG. 10, the band AEBf2 of the inversion pulse is a band obtained when the band AEBw2 of the inversion pulse has shifted in the frequency direction by an amount corresponding to the chemical shift $CS_{FS}$. The band AEBf2 of the inversion pulse virtually indicates the frequency band of the inversion pulse with respect to the fat components. In FIG. 10, it does not mean that the flip pulse is applied twice in the band AEBw2 and in the band AEBf2. Rather, FIG. 10 illustrates how the flip pulse is applied to the water components and to the fat components during the application of the flip pulse at one time.

As illustrated in FIG. 10, the band AEBf2 of the post-determining-process inversion pulse is wider than the band Bf1 of the flip pulse. Further, the first slice magnetic field intensity $G_{ss1}$ is equal to the post-determining-process second slice magnetic field intensity $ADG_{ss2}$. Accordingly, as illustrated in FIG. 10, the range AEIf in the slice direction where the fat components are excited by the post-determining-process inversion pulse includes the range DFf. In other words, as illustrated in FIG. 10, the position in the slice direction in which the fat is excited by the post-determining-process inversion pulse includes the position in the slice direction in which the fat is excited by the flip pulse.

To make it easier to understand, the chemical shift $CS_{SD}$, is exaggerated in FIG. 10. The present embodiment is not limited to the example illustrated in FIG. 10.

FIG. 11 is a drawing illustrating an example of a positional relationship between the range AEIf and the range DFf, in relation to FIG. 10. The reference characters "IP" in FIG. 11 indicate the range Dw, in the slice direction, of the water excited by the application of the inversion pulse to the slice SI and the range AEIf, in the slice direction, of the fat excited by the application of the post-determining-process inversion pulse. Further, the reference characters "FP" in FIG. 11 indicate the range Dw, in the slice direction, of the water excited by the application of the flip pulse to the slice SI and the range DFf, in the slice direction, of the fat excited by the application of the flip pulse.

As illustrated in FIG. 11, the range AEIf includes the region ABEx. In the region ABEx, the MR signal of the fat is suppressed because the flip pulse is applied when the time TI has elapsed since the application of the post-determining-process inversion pulse. Consequently, according to the present application example, it is possible to further reduce the impacts on the image quality of the image generated by implementing the STIR method.

The MRI apparatus 100 according to the application example of the embodiment described above is configured to determine the intensity of the slice selecting gradient magnetic field applied together with the inversion pulse, so as to be closer to the intensity of the slice selecting gradient magnetic field applied together with the flip pulse and is configured to determine the parameter (one of the band and the application length) of the inversion pulse, so that the slice thickness ESI related to applying the inversion pulse includes the slice thickness ST related to applying the flip pulse. In other words, by using the MRI apparatus 100 according to the application example, it is possible to cause the intensities of the slice selecting gradient magnetic fields (the slopes of the slice selecting gradient magnetic fields illustrated in FIG. 10) to be equal or similar between the inversion pulse and the flip pulse and to also make the band of the inversion pulse wider than that of the flip pulse.

As a result, as for a slice profile of the inversion pulse (hereinafter, "inversion pulse profile") with respect to the position of the slice to which the inversion pulse is applied, even when the inversion pulse profile has incompleteness, for example, it is possible to reduce loss of the application of the inversion pulse to the slice to which the flip pulse is applied. In addition, by increasing the slice thickness for the inversion pulse to the range AEIf, it is possible to reduce the occurrence of a flow ghost (which may be called a flow artifact) in the MR image generated by implementing the STIR method.

As explained above, according to the present application example, it is possible to further inhibit image quality degradation of the MR image generated by implementing the STIR method and to thus further stabilize the image quality of the MR image. Because the other advantageous effects of the present application example are the same as those of the embodiment, the explanations thereof will be omitted.

When the technical concept of the embodiment is realized as an imaging parameter determining method, the method includes: obtaining (A) a parameter of one of inversion and flip pulses related to applying the one of the pulses and (B) the intensity of a slice selecting gradient magnetic field applied together with the one of the pulses in relation to selecting a slice to which the one of the pulses is applied; and determining one or both of (A) a parameter of the other of the inversion and flip pulses related to applying the other of the pulses and (B) the intensity of a slice selecting gradient magnetic field applied together with the other of the pulses in relation to selecting the slice to which the other of the pulses is applied, on the basis of one or both of (A) the parameter of the one of the pulses and (B) the intensity of the slice selecting gradient magnetic field applied together with the one of the pulses. Because the procedure and advantageous effects of the determining process related to the present imaging parameter determining method are the same as those described in the embodiment, the explanations thereof will be omitted.

When the technical concept of the present embodiment is realized as an imaging parameter determining program, the imaging parameter determining program is configured to cause a computer to realize: obtaining (A) a parameter of one of inversion and flip pulses related to applying the one of the pulses and (B) the intensity of a slice selecting gradient magnetic field applied together with the one of the pulses in relation to selecting a slice to which the one of the pulses is applied; and determining one or both of (A) a parameter of the other of the inversion and flip pulses related to applying the other of the pulses and (B) the intensity of a slice selecting gradient magnetic field applied together with the other of the pulses in relation to selecting the slice to which the other of the pulses is applied, on the basis of one or both of (A) the parameter of the one of the pulses and (B) the intensity of the slice selecting gradient magnetic field applied together with the one of the pulses.

For example, it is also possible to realize the determining process by installing the information processing program in a computer provided in a modality such as the MRI apparatus 100 or in a PACS server and loading the program into a memory. In that situation, it is also possible to distribute the program capable of causing a computer to implement the method, by storing the program in a storage medium such as a magnetic disk (e.g., a hard disk), an optical disk (e.g., a CD-ROM or a DVD), or a semiconductor memory. Because the procedure and advantageous effects of the determining process realized by the imaging parameter determining program are the same as those of the present embodiment, the explanations thereof will be omitted.

According to at least one aspect of the embodiments and the like described above, it is possible to reduce the impacts caused by the difference in chemical shift amounts in the slice direction between the inversion pulse and the flip pulse used in the STIR method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising: processing circuitry configured to
    based on one or both of (A) a first parameter related to applying a first pulse being one of an inversion pulse and a flip pulse, and (B) a first intensity of a slice selecting gradient magnetic field applied together with the first pulse in relation to selecting a first slice to which the first pulse is applied, determine one or both of (1) a second parameter related to applying a second pulse being another of the inversion and flip pulses other than the first pulse, and (2) a second intensity of the slice selecting gradient magnetic field applied together with the second pulse in relation to selecting a second slice to which the second pulse is applied; and
    perform a magnetic resonance scan using the determined one or both of the second parameter and the second intensity,
    wherein the processing circuitry is further configured to determine the one or both of the second parameter and the second intensity so as to diminish a difference between a position excited by the inversion pulse and a position excited by the flip pulse.

2. An imaging parameter determining method, comprising:
    obtaining (A) a first parameter of a first pulse being one of an inversion pulse and a flip pulse related to applying the first pulse, and (B) a first intensity of a slice selecting gradient magnetic field applied together with the first pulse in relation to selecting a first slice to which the first pulse is applied;
    determining one or both of (1) a second parameter of a second pulse being another of the inversion and flip pulses other than the first pulse related to applying the second pulse, and (2) a second intensity of the slice selecting gradient magnetic field applied together with the second pulse in relation to selecting a second slice to which the second pulse is applied, based on one or both of (A) the first parameter of the first pulse, and (B) the first intensity of the slice selecting gradient magnetic field applied together with the first pulse; and
    performing a magnetic resonance scan using the determined one or both of the second parameter and the second intensity, wherein
    the determining step further includes determining the one or both of the second parameter and the second intensity so as to diminish a difference between a position excited by the inversion pulse and a position excited by the flip pulse.

3. A non-transitory computer-readable storage medium storing therein an imaging parameter determining program configured to, when executed, cause a computer to perform a method comprising:
    obtaining (A) a first parameter of a first pulse being one of an inversion pulse and a flip pulse related to applying the first pulse, and (B) a first intensity of a slice selecting gradient magnetic field applied together with the first pulse in relation to selecting a first slice to which the first pulse is applied;
    determining one or both of (1) a second parameter of a second pulse being another of the inversion and flip pulses other than the first pulse related to applying the second pulse, and (2) a second intensity of the slice selecting gradient magnetic field applied together with the second pulse in relation to selecting a second slice to which the second pulse is applied, based on one or both of (A) the first parameter of the first pulse, and (B) the first intensity of the slice selecting gradient magnetic field applied together with the first pulse; and
    Performing a magnetic resonance scan using the determined one or both of the second parameter and the second intensity,
    wherein the determining step further includes determining the one or both of the second parameter and the second intensity so as to diminish a difference between a position excited by the inversion pulse and a position excited by the flip pulse.

4. The magnetic resonance imaging apparatus according to claim 1, wherein the processing circuitry is further configured to determine the one or both of the second parameter and the second intensity so as to align a position excited by the inversion pulse with a position excited by the flip pulse.

5. The magnetic resonance imaging apparatus according to claim 1, wherein
    the processing circuitry is further configured to determine an intensity of the slice selecting gradient magnetic field applied together with the inversion pulse, so as to be closer to an intensity of the slice selecting gradient magnetic field applied together with the flip pulse, and
    the processing circuitry is further configured to determine a parameter of the inversion pulse so that a slice thickness related to applying the inversion pulse includes a slice thickness related to applying the flip pulse.

6. The magnetic resonance imaging apparatus according to claim 1, wherein the second parameter includes one of an application length and a band of the second pulse.

7. The magnetic resonance imaging apparatus according to claim 1, wherein the inversion pulse is a pulse related to fat suppression involving slice selection.

8. The magnetic resonance imaging apparatus according to claim 1, wherein the processing circuitry is further configured to determine one or both of (A) a parameter related to the inversion pulse, and (B) an intensity of the slice selecting gradient magnetic field applied together with the inversion pulse, based on one or both of (A) a parameter related to the flip pulse, (B) and an intensity of the slice selecting gradient magnetic field applied together with the flip pulse.

* * * * *